United States Patent
Chin et al.

(10) Patent No.: US 7,064,371 B2
(45) Date of Patent: Jun. 20, 2006

(54) LOW LEAKAGE ONE TRANSISTOR STATIC RANDOM ACCESS MEMORY

(75) Inventors: Pin-Shyne Chin, Hsinchu (TW); Wen-Jye Yue, Hsinchu (TW); Hsien-Chin Peng, Hsin-Chu (TW)

(73) Assignee: Taiwan Semiconductor Manufacturing Co., Ltd., Taiwan (TW)

( * ) Notice: Subject to any disclaimer, the term of this patent is extended or adjusted under 35 U.S.C. 154(b) by 0 days.

(21) Appl. No.: 10/912,511

(22) Filed: Aug. 5, 2004

(65) Prior Publication Data

US 2005/0009271 A1    Jan. 13, 2005

Related U.S. Application Data

(62) Division of application No. 09/785,114, filed on Feb. 20, 2001, now Pat. No. 6,790,724.

(51) Int. Cl.
*H01L 27/108* (2006.01)

(52) U.S. Cl. .................................................. 257/296

(58) Field of Classification Search ................ 257/299, 257/301, E21.661, E27.098, 296
See application file for complete search history.

(56) References Cited

U.S. PATENT DOCUMENTS

| | | | |
|---|---|---|---|
| 5,134,085 A | 7/1992 | Gilgen et al. | 437/52 |
| 5,686,336 A | 11/1997 | Lee | 437/52 |
| 5,953,606 A | 9/1999 | Huang et al. | 438/241 |
| 5,998,820 A * | 12/1999 | Chi | 257/296 |
| 6,078,087 A | 6/2000 | Huang et al. | 257/393 |
| 6,262,447 B1 | 7/2001 | Chi | 257/296 |
| 6,274,441 B1 | 8/2001 | Mandelman et al. | 438/286 |
| 6,504,780 B1 | 1/2003 | Leung | 365/222 |

OTHER PUBLICATIONS

Leung et al., "The Ideal SoC Memory: 1T-SRAM", 13th International ASIC/SoC Conference Proceedings, IEEE, Sep. 13-16, 2000, pp. 32-35.*

* cited by examiner

*Primary Examiner*—W. David Coleman

(57) ABSTRACT

The invention forms a 1T Static Random Access Memory (SRAM) with a low concentration cell node region and a higher concentration bit line region (e.g., second bit line region). The method of the invention forms a 1T Static Random Access Memory (SRAM) that uses a resist mask to block a high concentration implant into the cell node region, but allows the high concentration implant into the bit line region to form a second (high concentration) bit line. The invention's 1T SRAM, with the low concentration cell node, has reduced p-n junction leakage at the cell node and increase date retention time.

9 Claims, 3 Drawing Sheets

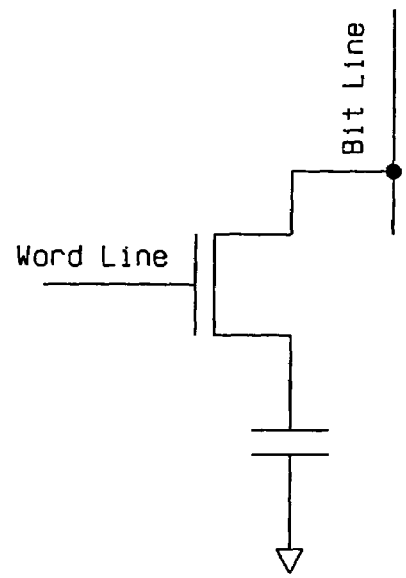
*FIG. 1 – Prior Art*
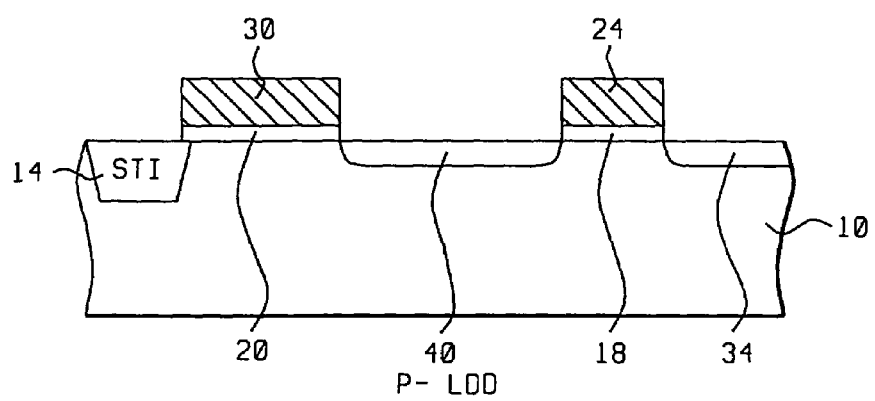
*FIG. 2*

LOW LEAKAGE ONE TRANSISTOR STATIC RANDOM ACCESS MEMORY

Related Applications

This application is a divisional of Application Ser. No. 09/785,114, filed Feb. 20, 2001 U.S. Pat. No. 6,790,724. The entire disclosure of Application Ser. No. 09/785,114 is incorporated herein by reference.

BACKGROUND OF INVENTION

1) Field of the Invention

This invention relates generally to fabrication semiconductor memory devices and particularly to the structure of a one transistor (1T) Static Random Access Memory (SRAM) cell.

2) Description of the Prior Art

FIG. 1 shows a schematic of a one transistor (1T) Static Random Access Memory (SRAM) cell. The 1T SRAM is designed for high speed and low cost logic products. However, the inventors have found that the 1 T SRAM cell has performance degradation that can be reduced.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,686,336 (Lee) shows a 4T SRAM layout. U.S. Pat. No. 6,078,087 (Huang et al.) and U.S. Pat. No. 5,953,606 (Huang et al.) shows TFT SRAM layouts.

SUMMARY OF THE INVENTION

It is an object of the present invention to provide a method for fabricating a 1T SRAM with low leakage.

It is an object of the present invention to provide a method for fabricating a 1T SRAM with low leakage using a P minus (P−) region on the cell storage node.

It is an object of the present invention to provide a method for fabricating a 1T SRAM with a revised cell layout with a blocked P plus (P+) S/D ion implant (I/I) on the cell storage node n-p junction.

The invention forms 1T Static Random Access Memory (SRAM) with a low concentration cell node region and a higher concentration bit line region (e.g., second bit line region).

To accomplish the above objectives, the present invention provides a structure for a 1T SRAM which is characterized:

a word line structure and a capacitor plate structure on a substrate; a cell node in the substrate between the word line structure and the capacitor plate structure; a bit line region in the substrate adjacent to the word line structure, a capacitor plate structure is comprised of a capacitor dielectric on the substrate and a conductive plate layer on the capacitor dielectric; the capacitor plate structure overlying a plate region of the substrate; the plate region and the conductive plate layer acting as one plates of a capacitor;

the bit line region consists of a first bit line region and a second bit line (lightly doped) region; the first bit line region has the same impurity concentration as the cell node; the second bit line region has an impurity concentration (e.g., atoms/cc) greater than the cell node by preferably at least an order of 10.

The inventors have found an unexpected increase in the performance of the SRAM with the low concentration cell node region and the second (higher concentration) bit line. The inventors have found that the 1 T SRAM cell has performance degradation due to the high junction leakage on cell storage node. By blocking the P+ implant into the cell node, the n-p junction (cell node junction) leakage was reduced and the cell data retention time increased.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1 shows a schematic of a one transistor (1T) Static Random Access Memory (SRAM) cell according to the prior art.

FIGS. 2 through 4 are cross sectional views for illustrating a method for manufacturing a preferred embodiment of the 1T Static Random Access Memory (SRAM) according to the present invention.

DETAILED DESCRIPTION OF THE PREFERRED EMBODIMENTS

I. Method for 1T Static Random Access Memory (SRAM)

Figure 3:
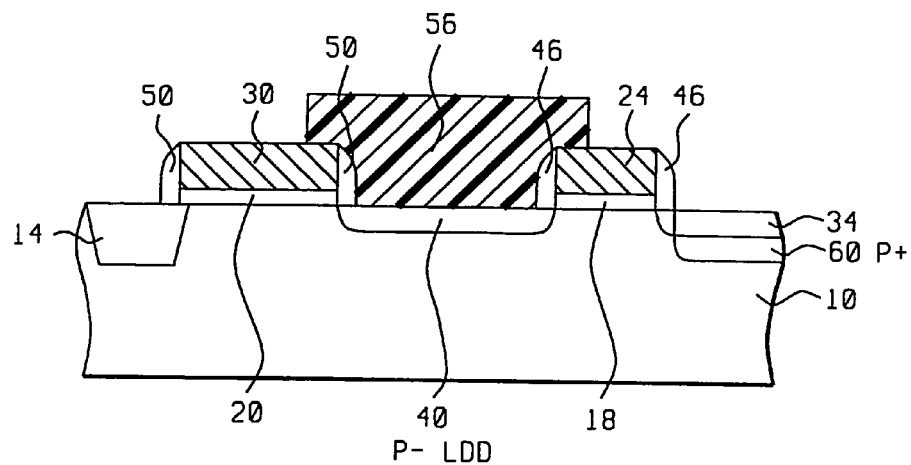
Figure 4:
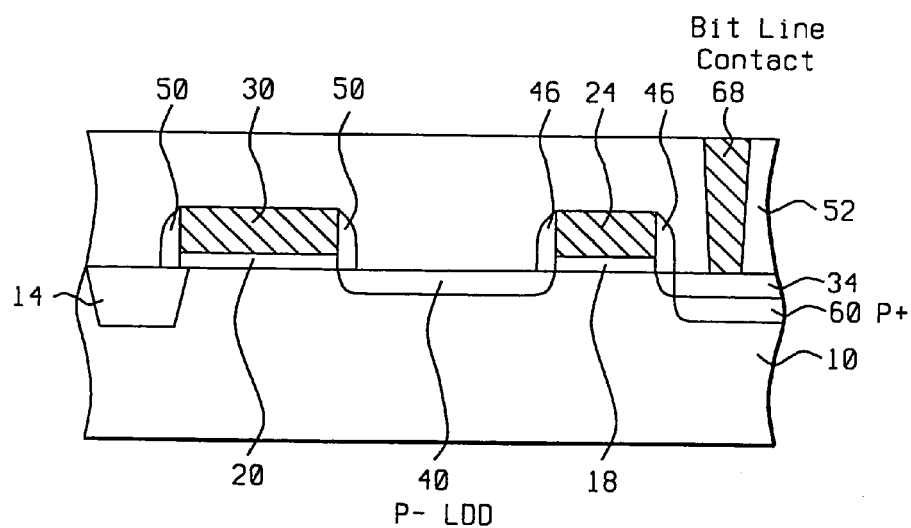
Figure 5:
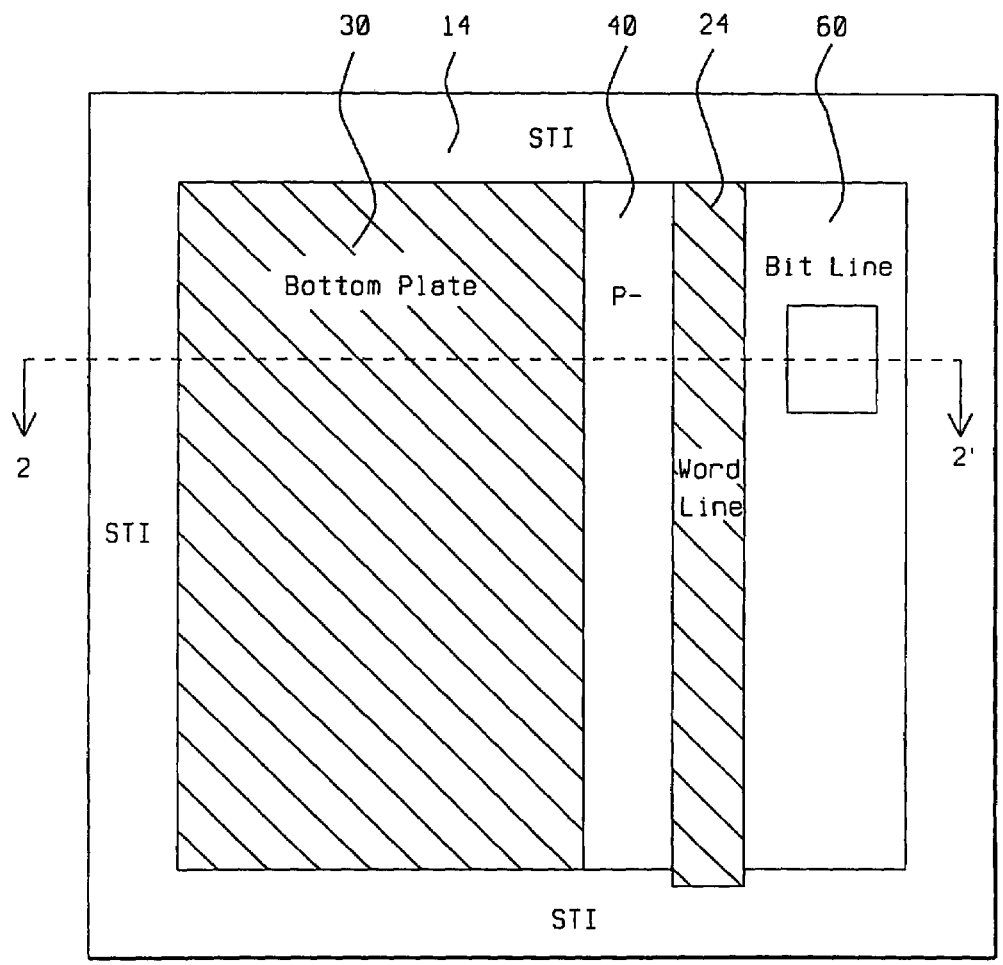
FIG. 5 is a top down view of a preferred embodiment of the 1T Static Random Access Memory (SRAM) according to the present invention.

The method of fabrication of a 1T SRAM is shown in cross sectional FIGS. 2 to 4 and top down FIG. 5.

As shown in FIGS. 2 and 5, shallow trench isolations (STI) 14 are formed in the substrate 10 using conventional processes. FIG. 5 shows a top down view. STI regions 14 are located around the devices for isolation.

The substrate can be any semiconductor substrate. Preferably the substrate is a silicon wafer that is doped with a p type impurity such as boron (B) to a concentration of between 5E14 and 1E15 atoms/cc. In the FIGS, the substrate 10 can have a n-type well (not shown) that the 1T SRAM is formed on. That is the substrate 10 can represent a wafer with a N-well (second conductivity type is n-type) with a concentration between 1E17 and 1E18 atoms/cc near the invention's subsequently formed 1T SRAM. Preferably the region in the substrate surrounding the invention's subsequently formed 1T SRAM has a n-type doping (e.g., second conductivity type is n-type) with a concentration between 1E17 and 1E18 atoms/cc.

A. Word Line Structure 18 24 and a Capacitor Plate Structure 20 30

Next, a word line structure 18 24 and a capacitor plate structure 20 30 are formed on a substrate 10.

A dielectric layer and a conductive layer are formed over the substrate. Next, the dielectric layer and the conductive layer are patterned to form the word line structure 18 24 and a capacitor plate structure 20 30. The dielectric layer is preferably comprised of oxide having a thickness of between about 40 and 60 Å. The conductive layer is preferably comprised of polysilicon and preferably has a thickness of between about 1500 and 2500 Å.

The capacitor plate structure 20 30 is comprised of a capacitor dielectric 20 on the substrate 10 and a conductive plate layer 30 on the capacitor dielectric 20. The capacitor plate structure 20 30 overlying a plate region of the substrate. The plate region and the conductive plate layer 30 act as plates of a capacitor.

B. LDD I/I—Cell Node Region 40 and First Bit Line Region 34

As shown in FIG. 2, in a key step, we implant ions of a first conductivity type (e.g., p type) into the substrate forming a cell node region 40 in the substrate 10 between the word line structure 18 24 and the capacitor plate structure 20 30; and forming a first bit line region 34 in the substrate adjacent to the word line structure 18 24. The cell node region 40 and the first bit line region 34 preferably do not intersect.

In a preferred embodiment, both the cell node region 40 and the first bit line region 34 (low conc) have a p-type doping and have an impurity concentration between 1E17 and 1E19 atoms/CC and more preferably between 1E18 and 1E19 atoms/CC. This low impurity concentration is at the p minus (p−) level.

In another embodiment, the cell node region 40 and the first bit line region 34 can be formed with two separate ion implant steps (e.g., mask the non-implanted areas). This allows the cell node region 40 and the first bit line region 34 to have different concentrations. For example, the first bit line region 34 can have a concentration between 1E18 and 1E19 atoms/cc and the cell node region 40 can have a concentration between 1E17 and 1E18 atoms/cc.

C. Spacer

Referring to FIG. 3, we form spacers 46 and 50 on the sidewalls of the word line structure 18 24 and the capacitor plate structure 20 30. The spacer are preferably formed of oxide or nitride and are formed by conventional means.

D. Resist 56 to Block P+ I/I

In a critical step in the invention, as shown in FIG. 3, we form a mask (e.g., resist) pattern 56 over the cell node 40. Any implant blocking mask can be used. This resist pattern serves to block a subsequent high concentration (e.g., P+) implant into the node cell region.

E. P+ Implant into Bit Line

Next, we implant ions of a first conductivity type into the substrate to form a high concentration bitline 60. The high concentration bitline 60 preferably has p-type doping (e.g., boron) and preferably has a concentration between 1E20 and 1E21 Atom/cc. This is at the P plus (p+) doping level. It is critical that these ions are not implanted into the cell node 40.

The second bit line region 60 preferably has an impurity concentration greater than the cell node region 40 by at least a factor of 10.

The inventors have found an unexpected increase in the performance of the SRAM with the low concentration cell node region 40 and the second (higher concentration) bit line 60. By blocking the P plus (P+) implant into the cell node, the n-p junction (cell node junction) leakage was unexpectedly and dramatically reduced and the cell data retention time increased.

F. FIG. 4—Form a Bitline Contact 68

Next, the resist 56 is removed.

As shown in FIG. 4, we form a dielectric layer (e.g., IDLO) 52 over the substrate.

A shown in FIGS. 4 and 5, we form a bitline contact 68 to the high concentration bitline 60. Other contacts (not shown) are formed to the other elements (e.g., cell node, word line etc.).

FIG. 5 is a top down view of a preferred embodiment of the 1T Static Random Access Memory (SRAM) according to the present invention.

II. Description of the 1T SRAM Structure

The present invention provides a structure for a 1T SRAM which is characterized as follows. FIG. 4 shows a cross sectional view of the 1T SRAM and FIG. 5 shows a top down view.

As shown in FIGS. 4 and 5, a word line structure 18 24 and a capacitor plate structure 20 30 are on a substrate 10. A cell node region 40 is in the substrate 10 between the word line structure and the capacitor plate structure 20 30. A bit line region 34 60 is in the substrate adjacent to the word line structure 18 24. The cell node region 40 and the bit line region 34 do not intersect.

The capacitor plate structure 20 30 is preferably comprised of a capacitor dielectric 20 on the substrate 10 and a conductive plate layer 30 on the capacitor dielectric 20. The capacitor plate structure 20 30 overlies a plate region of the substrate 10. The plate region and the conductive plate layer 30 act as one plate of a capacitor.

The bit line region 34 60 consists of a first bit line region 34 and a second bit line region 60. The first bit line region 34 has about the same impurity concentration as the cell node 40.

A critical element of the invention is that the second bit line region 60 has an impurity concentration greater than the cell node 40 by at least a factor of 10 atoms/cc. In a preferred embodiment, the first bit line region 34 (low conc) has a p-type doping and has a impurity concentration between 1E18 and 1E19 atom/cm$^3$, the second bit line region (high conc) 60 has a p-type doping and has a impurity concentration between 1E20 and 1E21 atom/cc and the cell node region 40 has a p-type doping and has an impurity concentration between 1E17 and 1E18 atom/cc.

The second bit line 60 has an impurity concentration preferably greater than the cell node region 40 by at least a factor of 10.

FIG. 5 shows a top down view. STI regions 14 are located around the devices for isolation.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention Unless explicitly stated otherwise, each numerical value and range should be interpreted as being approximate as if the word "about" or "approximately" preceded the value of the value or range.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A 1T SRAM comprising:
   a word line structure on a substrate;
   a capacitor plate structure on said substrate;
   a cell node region in said substrate between said word line structure and said capacitor plate structure, said cell node region having an impurity concentration; and
   a bit line region in said substrate adjacent to said word line structure;
   wherein said bit line region includes a first region having an impurity concentration greater than the impurity concentration of said cell node region.

2. The 1T SRAM of claim 1 wherein said substrate is doped with an n-type impurity; said substrate having an impurity concentration between 1E17 and 1E18 atoms/cc.

3. The 1T SRAM of claim 1 wherein said substrate is p doped and has a n-well under said word line structure and said capacitor plate structure; said n-well is doped with an n-type impurity; said n-well has an impurity concentration between 1E17 and 1E18 atoms/cc.

4. The 1T SRAM of claim 1 wherein said cell node region and said bit line region do not intersect.

5. The 1T SRAM of claim 1 wherein said capacitor plate structure comprises:
   a conductive plate region of said substrate;
   a capacitor dielectric disposed on said substrate; and
   a conductive plate layer disposed on said capacitor dielectric.

6. The 1T SRAM of claim 1 wherein said bit line region further comprises a second region having an impurity concentration which is substantially the same as the impurity concentration of said cell node region.

7. The 1T SRAM of claim 1, wherein said impurity concentration of said first region of said bit line region is greater than the impurity concentration of said cell node region by at least a factor of 10.

8. The 1T SRAM of claim 1 wherein said first region of said bit line region has a p-type doping and a impurity concentration between 1E20 and 1E21 atoms/cc.

9. The 1T SRAM of claim 6 wherein said second region of said bit line region and said cell node region each have a p-type doping and an impurity concentration between 1E17 and 1E19 atoms/cc.

* * * * *